US 12,483,218 B2

(12) United States Patent
Lin

(10) Patent No.: US 12,483,218 B2
(45) Date of Patent: Nov. 25, 2025

(54) VARIABLE GAIN AMPLIFIER AND TRANSMITTING APPARATUS

(71) Applicant: SANECHIPS TECHNOLOGY CO., LTD., Guangdong (CN)

(72) Inventor: Siyu Lin, Guangdong (CN)

(73) Assignee: SANECHIPS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 18/709,090

(22) PCT Filed: Mar. 21, 2022

(86) PCT No.: PCT/CN2022/081919
§ 371 (c)(1),
(2) Date: May 10, 2024

(87) PCT Pub. No.: WO2023/087589
PCT Pub. Date: May 25, 2023

(65) Prior Publication Data
US 2025/0007481 A1 Jan. 2, 2025

(30) Foreign Application Priority Data
Nov. 17, 2021 (CN) .......................... 202111362245.5

(51) Int. Cl.
H03G 3/30 (2006.01)
H03G 1/00 (2006.01)
H04B 1/04 (2006.01)

(52) U.S. Cl.
CPC ......... H03G 3/3042 (2013.01); H03G 1/0088 (2013.01); H04B 1/04 (2013.01); H04B 2001/0416 (2013.01)

(58) Field of Classification Search
CPC ..... H03F 1/22; H03F 1/30; H03F 3/24; H03F 3/45; H03F 3/68; H03F 3/193;
(Continued)

(56) References Cited

U.S. PATENT DOCUMENTS

2003/0027531 A1 2/2003 Malhi et al.
2006/0261893 A1* 11/2006 Chiang ................ H03G 1/0088
330/254
(Continued)

FOREIGN PATENT DOCUMENTS

JP 2004128704 A 4/2004
JP 2007259409 A 10/2007

OTHER PUBLICATIONS

European Patent Office, the Extended European Search Report dated Jan. 24, 2025, for corresponding EP application No. 22894135.7.
(Continued)

Primary Examiner — Shawkat M Ali
(74) Attorney, Agent, or Firm — Li & Cai Intellectual Property (USA) Office

(57) ABSTRACT

Provided in the present disclosure is a variable gain amplifier, including: a voltage signal input end; a high level generation module including two high level signal output ends, and configured to convert a voltage signal input from the voltage signal input end into a first high level signal and a second high level signal; a switch signal conversion module including a high level signal input end, N digital signal input ends and N switch signal output ends, and configured to output, through corresponding switch signal output ends and under the control of signals input from the digital signal input ends, gain control signals associated with a signal output from the first high level signal output end; and an amplification module including an amplification unit and N stages of gain control units, where N is a positive integer not less than 1. Further provided is a transmitting apparatus.

10 Claims, 3 Drawing Sheets

(58) Field of Classification Search
CPC .......... H03G 1/00; H03G 1/0088; H03G 3/00; H03G 3/30; H03G 3/3042; H04B 1/04; H04B 1/38
USPC ........ 330/254, 278, 284; 375/295–297, 345; 455/73, 127, 323
See application file for complete search history.

(56) References Cited

U.S. PATENT DOCUMENTS

| | | | |
|---|---|---|---|
| 2008/0224775 A1* | 9/2008 | Taylor ...................... | H03F 3/19 330/254 |
| 2015/0249437 A1 | 9/2015 | Morishita et al. | |
| 2019/0372540 A1* | 12/2019 | Muralidharan ........... | H03F 1/22 |
| 2021/0126598 A1 | 4/2021 | Rogers | |

OTHER PUBLICATIONS

Korean Patent Office, the first Office action dated Mar. 11, 2025, for corresponding KR application No. 10-2024-7016122.

* cited by examiner

VARIABLE GAIN AMPLIFIER AND TRANSMITTING APPARATUS

CROSS-REFERENCE TO RELATED APPLICATIONS

This application is a National Phase application filed under 35 U.S.C. 371 as a national stage of PCT/CN2022/081919, filed on Mar. 21, 2022, an application claiming claims priority to Chinese patent application No. 202111362245.5 filed on Nov. 17, 2021, the entirety of which is incorporated hereby by reference.

TECHNICAL FIELD

The present disclosure relates to, but is not limited to, the field of communication devices, and particularly relates to a variable gain amplifier and a transmitting apparatus including the variable gain amplifier.

BACKGROUND

The variable gain amplifier is an important component of a transceiver system and the like, and common variable gain amplifiers comprise a variable gain amplifier having a digital current steering structure, a variable gain amplifier having an analog current steering structure, and a variable gain amplifier having a digital step attenuator structure.

Among these variable gain amplifiers, the variable gain amplifier having a digital current steering structure is most widely applied. However, the gain step and the maximum gain of this type of variable gain amplifier are greatly affected by the temperature and the process corner, resulting in: the error of the variable gain amplifier with the digital current steering structure varies with temperature and process angle.

SUMMARY

Embodiments of the present disclosure provide a variable gain amplifier and a transmitting apparatus including the variable gain amplifier.

As a first aspect of the present disclosure, there is provided a variable gain amplifier, including: a voltage signal input end; a high level generation module including a first high level signal output end and a second high level signal output end, the high level generation module being configured to convert a voltage signal input from the voltage signal input end into a first high level signal and a second high level signal, wherein the first high level signal and the second high level signal are both positively correlated with a temperature of the variable gain amplifier, and the first high level signal has a potential higher than that of the second high level signal; a switch signal conversion module including a high level signal input end, N digital signal input ends and N switch signal output ends, wherein the high level signal input end is electrically connected to the first high level signal output end, the N switch signal output ends are in one-to-one correspondence with the N signal input ends, and the switch signal conversion module is configured to output, through corresponding switch signal output ends and under the control of signals input from the digital signal input ends, gain control signals associated with the first high level signal output from the first high level signal output end; and an amplification module including an amplification unit and N stages of gain control units, wherein the N stages of gain control units are in one-to-one correspondence with the N switch signal output ends of the switch signal conversion module, each gain control unit has a control end electrically connected to a corresponding switch signal output end, an input end electrically connected to the voltage signal input end, and an output end electrically connected to an intermediate node of the amplification unit; each gain control unit is capable of providing a voltage signal positively correlated with the temperature to the intermediate node under the control of a signal received by the control end of the gain control unit; and the amplification unit has an input end electrically connected to the second high level signal output end, and a control end electrically connected to the first high level signal output end, where N is a positive integer not less than 1.

As a second aspect of the present disclosure, there is provided a transmitting apparatus including an intermediate frequency variable gain amplifier, a mixer, a radio frequency variable gain amplifier, and a power amplifier connected in sequence, wherein at least one of the intermediate frequency variable gain amplifier or the radio frequency variable gain amplifier is the variable gain amplifier as described above in the present disclosure.

When an input signal is amplified by the variable gain amplifier, a power supply voltage is supplied to the high level generation module and the gain control units through the voltage signal input end while an input signal is received by the input end of the amplification unit.

DETAIL DESCRIPTION OF EMBODIMENTS

To improve understanding of the technical solution of the present disclosure for those skilled in the art, the variable gain amplifier and the transmitting apparatus according to the present disclosure will be described below in detail in conjunction with the accompanying drawings.

Exemplary embodiments will be described more sufficiently below with reference to the accompanying drawings, but which may be embodied in different forms and should not be construed as limited to the embodiments set forth herein. Rather, these embodiments are provided so that the present disclosure will be thorough and complete, and will fully convey the scope of the present disclosure to those skilled in the art.

The embodiments of the present disclosure and features thereof may be combined with each other as long as they are not contradictory.

As used herein, the term "and/or" includes any and all combinations of one or more of the associated listed items.

The terminology used herein is for the purpose of describing specific embodiments only and is not intended to limit the present disclosure. As used herein, the singular forms "a", "an" and "the" are intended to include the plural forms as well, unless the context clearly indicates otherwise. It will be further understood that as used herein, the terms "comprise" and/or "consist of . . . " specify the presence of stated features, integers, elements and/or components, but do not preclude the presence or addition of one or more other features, integers, elements, components and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the existing art and the present disclosure, and will not be interpreted in an idealized or overly formal sense unless expressly so defined herein.

Figure 1:
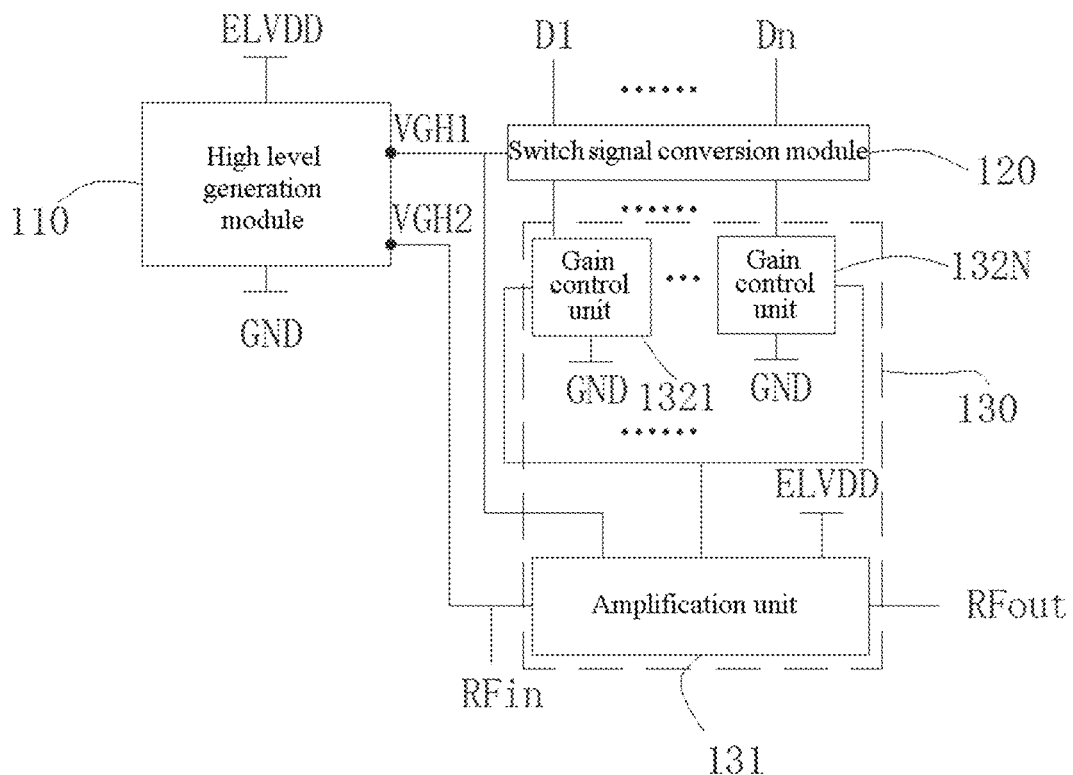
FIG. 1 is a schematic diagram of an implementation of a variable gain amplifier according to the present disclosure.

As a first aspect of the present disclosure, there is provided a variable gain amplifier which, as shown in FIG. 1, includes a voltage signal input end ELVDD, a high level generation module 110, a switch signal conversion module 120, and an amplification module 130.

The high level generation module 110 includes a first high level signal output end and a second high level signal output end, and is configured to convert a voltage signal input from the voltage signal input end ELVDD into a first high level signal VGH1 and a second high level signal VGH2. The first high level signal and the second high level signal are both positively correlated with a temperature of the variable gain amplifier, and the first high level signal has a potential higher than the second high level signal.

The switch signal conversion module 120 includes a high level signal input end, N digital signal input ends (D1 to DN) and N switch signal output ends. The high level signal input end is electrically connected to the first high level signal output end, the N switch signal output ends are in one-to-one correspondence with the N signal input ends, and the switch signal conversion module is configured to output, through corresponding switch signal output ends and under the control of signals input from the digital signal input ends, gain control signals associated with the first high level signal VGH1 output from the first high level signal output end. In the present disclosure, N is a positive integer not less than 1.

The amplification module 130 includes an amplification unit 131 and N stages of gain control units (1321 to 132N). The N stages of gain control units (i.e., N gain control units) are in one-to-one correspondence with the N switch signal output ends of the switch signal conversion module. Each gain control unit has a control end electrically connected to a corresponding switch signal output end, an input end electrically connected to the voltage signal input end, and an output end electrically connected to the intermediate node of the amplification unit. Each gain control unit is capable of providing a voltage signal positively correlated with a temperature (of the variable gain amplifier) to the intermediate node under the control of a signal received by the control end of the gain control unit. The amplification unit has an input end electrically connected to the second high level signal output end, and a control end electrically connected to the first high level signal output end.

When amplifying an input signal by the variable gain amplifier, it is required to supply the power supply voltage to the high level generation module and the gain control units through the voltage signal input end while receiving the input signal RFin by the input end of the amplification unit 131.

As the usage time increases, the temperature of the variable gain amplifier increases due to heat generation, the first high level signal output from the high level generation module 110 is positively correlated with the temperature of the variable gain amplifier, and the signal received by the control end of the amplification unit 131 of the amplification module 130 is also positively correlated with the temperature.

The first high level signal output from the high level generation module 110 has two functions: a first function of enabling the switch signal conversion module to output a control signal associated with the first high level signal (i.e., correlating a control signal of the gain control unit with temperature); and a second function of enabling the control end of the amplification unit to receive a control signal associated with the first high level signal (i.e., correlating a control signal of the amplification unit with temperature).

Since the control signal of the gain control unit 132 and the control signal of the amplification unit 131 are both correlated with temperature, changes in the output of the gain control unit 132 with the temperature are consistent with changes in the output of the amplification unit 131 with the temperature and the process corner, and further, the gain step of the variable gain amplifier provided in the present disclosure remains consistent under different temperature and process corner conditions, thereby reducing the influences of the temperature and the process corner on the gain error of the variable gain amplifier and the voltage gain in a maximum gain state, and enabling higher robustness.

In the present disclosure, the specific structure of the switch signal conversion module 120 is not particularly limited as long as the first high level signal can be converted into a control signal of the gain control unit under the control of the digital signal.

As an optional implementation, the switch signal conversion module 120 includes N switch signal conversion units (e.g., 121 to 12N), which are in one-to-one correspondence with the N digital signal input ends and in one-to-one correspondence with the N switch signal output ends.

Each switch signal conversion unit has a control end electrically connected to a corresponding digital signal input end (in the specific implementation shown in FIG. 2, a digital signal input end D1 is electrically connected to a control end of the switch signal conversion unit 121, and a digital signal input end DN is electrically connected to a control end of the switch signal conversion unit 12N), an input end electrically connected to the first high level signal end, and an output end electrically connected to a corresponding switch signal output end.

Each switch signal conversion unit is capable of electrically connecting the input end of the switch signal conversion unit with the output end of the switch signal conversion unit when the control end of the switch signal conversion unit receives a digital signal valid to the switch signal conversion unit. When the input end and the output end of the switch signal conversion unit are electrically connected, the first high level signal can be output to the control end of the corresponding gain control unit.

It should be noted that the digital signal may be 0 or 1. The digital signal valid to the switch signal conversion unit may be either 0 or 1, depending on the specific structure of the switch signal conversion unit.

Figure 2:
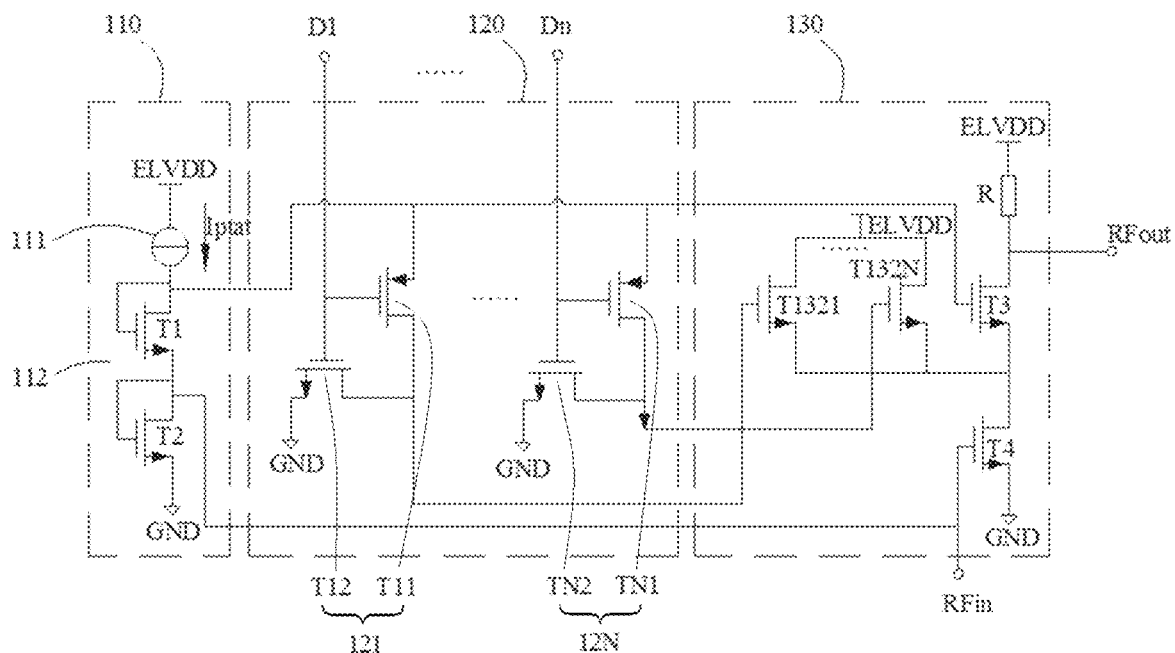
FIG. 2 is a schematic diagram of another implementation of the variable gain amplifier according to the present disclosure.

In the implementation shown in FIG. 2, the switch signal conversion unit includes a first switch signal conversion transistor (first switch transistor) and a second switch signal conversion transistor (second switch transistor). The gate electrode of the first switch signal conversion transistor and the gate electrode of the second switch signal conversion transistor are electrically connected with each other and both electrically connected to a corresponding digital signal input end. The first electrode (i.e., source electrode) of the first switch signal conversion transistor is electrically connected to the high level signal input end. The second electrode (i.e., drain electrode) of the first switch signal conversion transistor is electrically connected to the first electrode (i.e., drain electrode) of the second switch signal conversion transistor. The second electrode (i.e., source electrode) of the second switch signal conversion transistor is electrically connected to a low level signal reference end. One of the first switch signal conversion transistor or the second switch signal conversion transistor is a P-type transistor, while the other is an N-type transistor.

Specifically, when the first switch signal conversion transistor is a P-type transistor and the second switch signal conversion transistor is an N-type transistor, the digital signal valid to the switch signal conversion unit is 0. When the first switch signal conversion transistor is an N-type transistor and the second switch signal conversion transistor is a P-type transistor, the digital signal valid to the switch signal conversion unit is 1.

In the implementation shown in FIG. 2, the first switch signal conversion transistor is a P-type transistor, and the second switch signal conversion transistor is an N-type transistor.

The switch signal conversion unit 121 includes a first switch transistor T11 and a second switch transistor T12, and the switch signal conversion unit 12N includes a first switch transistor TN1 and a second switch transistor TN2.

As shown in FIG. 2, the first electrode (i.e., source electrode) of the first switch transistor T11 is electrically connected to the first high level signal output end, and the first electrode (i.e., source electrode) of the first switch transistor TN1 is also electrically connected to the first high level signal output end. The second electrode (i.e., source electrode) of the second switch transistor T12 is electrically connected to a low level signal reference end, and the second electrode (i.e., source electrode) of the second switch transistor TN2 is also electrically connected to the low level signal reference end.

When the control end of the switch signal conversion unit 121 receives a digital signal 0, the first electrode (i.e., source electrode) and the second electrode (i.e., drain electrode) of the first switch transistor T11 are electrically connected (i.e., the first switch transistor T11 is turned on), while the first electrode (i.e., drain electrode) and the second electrode (i.e., source electrode) of the second switch transistor T12 are electrically disconnected (i.e., the second switch transistor T12 is turned off), so that the signal at the first high level signal end can be output to the control end of the gain control unit corresponding to the switch signal conversion unit 121.

When the control end of the switch signal conversion unit 12N receives a digital signal 0, the first electrode and the second electrode of the first switch transistor TN1 are electrically connected, while the first electrode and the second electrode of the second switch transistor TN2 are electrically disconnected, so that the signal at the first high level signal end may be output to the control end of the gain control unit corresponding to the switch signal conversion unit 12N.

The digital signals for controlling the gain control units can be converted into temperature-dependent control signals through the respective switch signal conversion units.

In the present disclosure, the specific structure of the high level generation module 110 is not particularly limited as long as it can generate a first high level signal positively correlated to temperature and a second high level signal positively correlated to temperature. In the implementation shown in FIG. 2, the high level generation module includes a current source 111 and a current conversion unit 112.

The input end of the current source 111 is formed as the voltage signal input end, and the current source 111 is capable of converting a voltage signal input from the voltage signal input end into a current Iptat that is positively correlated with the temperature of the variable gain amplifier.

The input end of the current conversion unit 112 is electrically connected to the output end of the current source 111, the first output end of the current conversion unit 112 is formed as the first high level signal output end, and the second output end of the current conversion unit 112 is formed as the second high level signal output end. The current conversion unit is configured to convert the current into the first high level signal and the second high level signal, respectively, and output the first high level signal through the first output end and the second high level signal through the second output end.

In the present disclosure, the specific structure of the current conversion unit 112 is not particularly limited. For example, the current conversion unit 112 includes a first current conversion transistor T1 and a second current conversion transistor T2.

In the implementation shown in FIG. 2, the gate electrode of the first current conversion transistor T1 is electrically connected to the first electrode of the first current conversion transistor T1 and formed as an input end of the current conversion unit 112, and the first output end is electrically connected to the first electrode of the first current conversion transistor T1. The gate electrode of the second current conversion transistor T2 and the first electrode of the second current conversion transistor T2 are electrically connected with each other and both electrically connected to the second electrode of the first current conversion transistor T1, the second output end is electrically connected to the first electrode of the second current conversion transistor T2, and the second electrode of the second current conversion transistor T2 is electrically connected to the low level signal reference end.

When a voltage signal is input from the voltage signal input end, the current source 111 converts the voltage signal into the first high level signal and inputs it to the first electrode and the gate electrode of the first current conversion transistor T1. When the first high level signal is received by the gate electrode of the first current conversion transistor T1, the first electrode and the second electrode of the first current conversion transistor T1 are electrically connected (i.e., the first current conversion transistor T1 is turned on), and the first high level signal is converted into another high level signal at the second electrode of the first current conversion transistor T1. When this another high level signal is received by the gate electrode of the second current conversion transistor T2, the first electrode and the second electrode of the second current conversion transistor T2 are electrically connected. Due to a divider action of the first current conversion transistor T1 and the second current conversion transistor T2, the voltage at a node (i.e., the second output end) between the second electrode of the first current transistor T1 and the first electrode of the second current transistor T2 becomes the second high level signal which has a lower potential than that of the first high level signal.

The second high level signal is supplied to the input end of the amplification unit 131 so that the input signal of the amplification unit 131 is also correlated with the temperature of the variable gain amplifier.

In some implementations, the first current conversion transistor T1 and the second current conversion transistor T2 are both N-type transistors. Each of the first electrode of the first current conversion transistor T1 and the first electrode of the second current conversion transistor T2 is a drain electrode, while each of the second electrode of the first current conversion transistor T1 and the second electrode of the second current conversion transistor T2 is a source electrode.

In the present disclosure, the specific structure of the gain control unit is not specifically limited. In the present disclosure, the gain control unit mainly functions to introduce an external power supply voltage to the intermediate node of the amplification unit 131 under the control of the control signals. As an optional implementation, the gain control unit may include a gain transistor having a gate electrode formed as the control end of the gain control unit, a first electrode (i.e., drain electrode) electrically connected to the voltage signal input end ELVDD, and a second electrode (i.e., source electrode) formed as the output end of the gain control unit.

Since the gate voltage of the gain transistor is temperature dependent, and the voltage at the second electrode (i.e., source electrode) of the gain transistor is also temperature dependent, the transconductance of the gain transistor varies with temperature.

In the amplification unit 131, the signals input from the input end is the input voltage RFin and the temperature-dependent second high level signal, so that the input voltage of the amplification unit 131 is temperature dependent, and the voltage of the intermediate node of the amplification unit 131 is also temperature dependent. As described above, the signal received by the control end of the amplification unit 131 is the first high level signal. Each node signal of the amplification unit 131 is temperature dependent, so that the gain step of the amplification unit 131 can be kept consistent under different temperature and process corner conditions.

In the implementation shown in FIG. 2, the gain control unit 1321 includes a gain transistor T1321, and the gain control unit 132N includes a gain transistor T132N.

In the implementation shown in FIG. 2, all the gain transistors are N-type transistors.

In the present disclosure, the specific structure of the amplification unit 131 is not particularly limited. Optionally, the amplification unit 131 includes a first amplification transistor T3 and a second amplification transistor T4. The gate electrode of the first amplification transistor T3 is formed as the control end of the amplification unit 131, the first electrode (i.e., drain electrode) of the first amplification transistor T3 is electrically connected to the output end of the amplification unit 131, and the second electrode (i.e., source electrode) of the first amplification transistor T3 is electrically connected to the intermediate node.

The gate electrode of the second amplification transistor T4 is formed as the input end of the amplification unit 131, the first electrode (i.e., drain electrode) of the second amplification transistor T4 is electrically connected to the second electrode (i.e., source electrode) of the first amplification transistor T3, and the second electrode (i.e., source electrode) of the second amplification transistor T4 is electrically connected to the low level signal reference end.

When the gate electrode of the second amplification transistor T4 receives the input signal RFin and the second high level signal, the second amplification transistor T4 works in an amplification region and outputs a signal to the intermediate node. The gate voltage of the first amplification transistor T3 is the first high level signal, and the source voltage of the first amplification transistor T3 includes a superposition of signals output from the respective gain control units and the signal output from the first electrode of the second amplification transistor T4. As such, the second amplification transistor T4 can output an amplified signal.

In the implementation shown in FIG. 2, the first amplification transistor T3 and the second amplification transistor are both N-type transistors.

In the present disclosure, the amplification unit 131 requires to receive a voltage signal input from an external power supply. Optionally, the first electrode (i.e., drain electrode) of the first amplification transistor T3 may be directly electrically connected to the voltage signal input end. In the implementation shown in FIG. 2, the amplification unit 131 further includes a resistance element R having one end electrically connected to the voltage signal input end and the other end electrically connected to the first electrode of the first amplification transistor T3.

The specific structure and operation principle of one implementation of the variable gain amplifier provided in the present disclosure will be explained and illustrated below with reference to FIG. 2. In this implementation, the low level signal reference end is a ground end GND.

In the implementation shown in FIG. 2, the high level generation module 110 includes a current source 111 and a current conversion unit 112. The current conversion unit 112 includes a first current conversion transistor T1 and a second current conversion transistor T2, and the first current conversion transistor T1 and the second current conversion transistor T2 are both N-type transistors. The gate electrode of the first current conversion transistor T1 is electrically connected to the first electrode of the first current conversion transistor T1, the second electrode of the first current conversion transistor T1 is electrically connected to the first electrode of the second current conversion transistor T2, and the second electrode of the second current conversion transistor T2 is electrically connected to the ground end GND.

The switch signal conversion unit 120 includes N switch signal conversion units, where a switch signal conversion unit 121 and a switch signal conversion unit 12N are shown in FIG. 2. The switch signal conversion unit 121 includes a first switch transistor T11 and a second switch transistor T12, and the switch signal conversion unit 12N includes a first switch transistor TN1 and a second switch transistor TN2. The first electrode (i.e., source electrode) of the first switch transistor T11 is electrically connected to the first high level signal output end, and the first electrode (i.e., source electrode) of the first switch transistor TN1 is also electrically connected to the first high level signal output end. The second electrode of the second switch transistor T12 is electrically connected to the low level signal reference end, and the second electrode of the second switch transistor TN2 is also electrically connected to the low level signal reference end.

When the control end of the switch signal conversion unit 121 receives a digital signal 0, the first electrode and the second electrode of the first switch transistor T11 are electrically connected, while the first electrode and the second electrode of the second switch transistor T12 are electrically disconnected, so that the signal at the first high level signal end can be output to the control end of the gain control unit (1321) corresponding to the switch signal conversion unit 121.

When the control end of the switch signal conversion unit 12N receives a digital signal 0, the first electrode and the second electrode of the first switch transistor TN1 are electrically connected, while the first electrode and the second electrode of the second switch transistor TN2 are electrically disconnected, so that the signal at the first high level signal end may be output to the control end of the gain control unit (132N) corresponding to the switch signal conversion unit 12N.

In the implementation shown in FIG. 2, the gain control unit 1321 includes a gain transistor T1321, and the gain control unit 132N includes a gain transistor T132N. The gate electrode of the gain transistor T1321 is electrically connected to the second electrode of the first switch transistor T11, and the gate electrode of the gain transistor T132N is electrically connected to the second electrode of the first switch transistor TN1.

The amplification unit 131 includes a first amplification transistor T3 and a second amplification transistor T4. The gate electrode of the first amplification transistor T3 is formed as the control end of the amplification unit 131, the first electrode of the first amplification transistor T3 is electrically connected to the output end of the amplification unit 131, and the second electrode of the first amplification transistor T3 is electrically connected to the intermediate node.

The gate electrode of the second amplification transistor T4 is formed as the input end of the amplification unit 131, the first electrode of the second amplification transistor T4 is electrically connected to the second electrode of the first amplification transistor T3, and the second electrode of the second amplification transistor T4 is electrically connected to the low level signal reference end.

The gate-source voltage of each gain transistor is consistent with the gate-source voltage of the first amplification transistor T3, and therefore, changes in the transconductance of each gain transistor with the temperature and the process corner are consistent with changes in the transconductance of the first amplification transistor T3 with the temperature and the process corner, so that the gain step of the variable gain amplifier can be kept consistent under different temperatures and process corner conditions, and thereby the variable gain amplifier has higher robustness.

Figure 3:
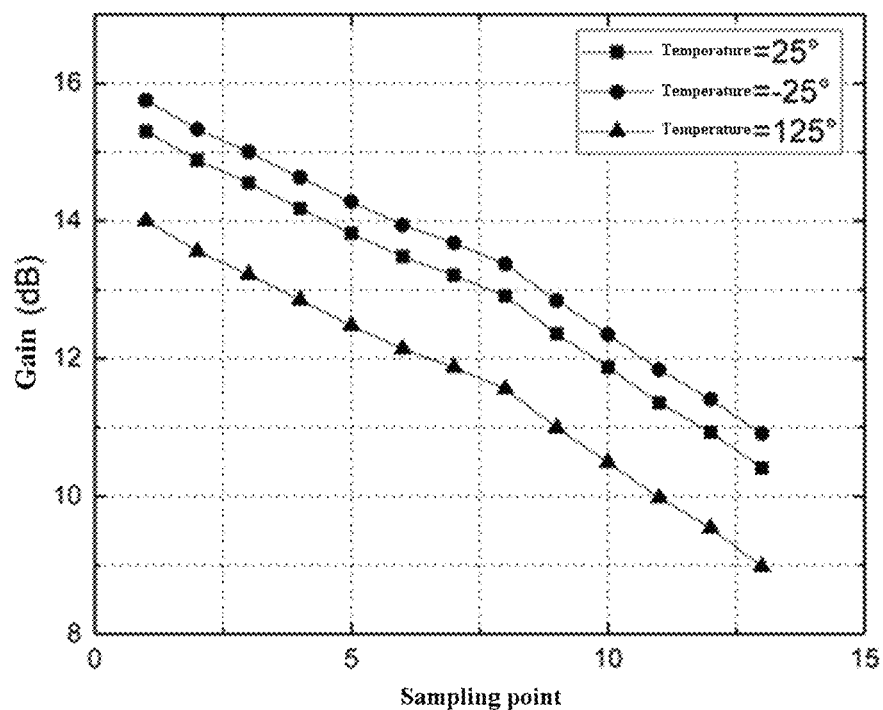
FIG. 3 shows gain curves of the variable gain amplifier at −25° C., 25° C. and 125° C. when N (the number of digital signal input ends or switch signal output ends) is 4.

Shown in FIG. 3 are gain steps and gain curves (sampling points on the abscissa and gain on the ordinate) of the variable gain amplifier at −25° C., 25° C. and 125° C. when N is 4. It can be seen that the variable gain amplifier has the same gain step at different temperatures.

Figure 4:
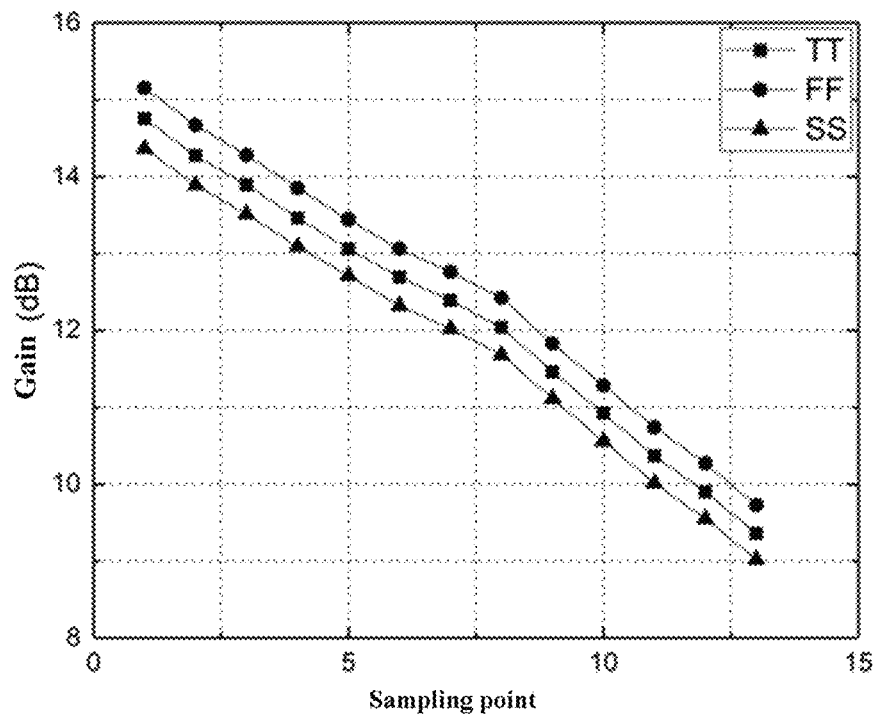
FIG. 4 shows gain curves of the variable gain amplifier at process corners TT, FF and SS when N is 4.

Shown in FIG. 4 are gain steps and gain curves (points on the abscissa and gain on the ordinate) of the variable gain amplifier at process corners TT (typical nmos and typical pmos), FF (fast nmos and fast pmos) and SS (slow nmos and slow pmos) when N is 4. It can be seen that the variable gain amplifier has the same gain step at different process corners.

Figure 5:
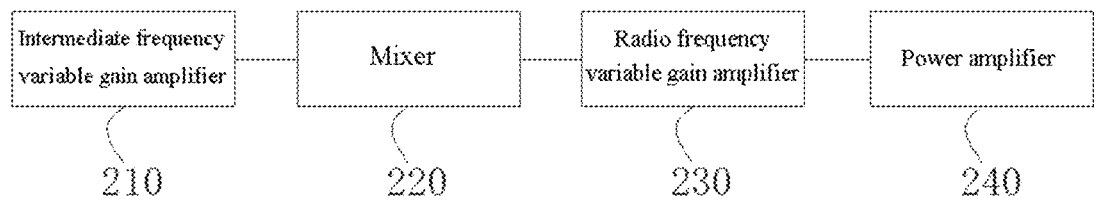
FIG. 5 is a schematic diagram of an implementation of a transmitting apparatus according to the present disclosure.

As a second aspect of the present disclosure, there is provided a transmitting apparatus which, as shown in FIG. 5, includes an intermediate frequency variable gain amplifier 210, a mixer 220, a radio frequency variable gain amplifier 230, and a power amplifier 240 connected in sequence. At least one of the intermediate frequency variable gain amplifier or the radio frequency variable gain amplifier is the variable gain amplifier as described above in the present disclosure.

Since the variable gain amplifier has higher robustness, the transmitting apparatus also has better performance.

Optionally, the transmitting apparatus may be a radio frequency front-end chip of a mobile phone, a receiving front-end chip of a phased array radar, a receiving front-end chip or component of a K-Ka band base station, a receiving front end chip or component of an automobile radar, any other radio frequency millimeter wave front-end chip or component, or any other radio frequency millimeter wave broadband related driver chip or component.

Those of ordinary skill in the art will appreciate that all or some systems in the above described method, functional modules/units in the apparatus may be implemented as software, firmware, hardware, and suitable combinations thereof. In a hardware implementation, the division between the functional modules/units mentioned in the above description does not necessarily correspond to the division of physical components; for example, one physical component may have multiple functions, or one function may be performed cooperatively by several physical components. Furthermore, in an implementation including hardware, the functional modules/units referred to in the above description may be implemented by circuits (e.g., integrated circuits) or circuit elements, unless otherwise specified or inappropriate. In this case, a module or unit that implements a certain function may also be referred to as a circuit that implements the function.

The present disclosure has disclosed exemplary embodiments, and although specific terms are employed, they are used and should be interpreted merely in a generic and descriptive sense, not for purposes of limitation. In some instances, as would be apparent to one skilled in the art, features, characteristics and/or elements described in connection with a particular embodiment may be used alone or in combination with features, characteristics and/or elements described in connection with another embodiment, unless expressly stated otherwise. It will, therefore, be understood by those skilled in the art that various changes in form and details may be made therein without departing from the scope of the present disclosure as set forth in the appended claims.

What is claimed is:

1. A variable gain amplifier, comprising:
   a voltage signal input end;
   a high level generation module comprising a first high level signal output end and a second high level signal output end, the high level generation module being configured to convert a voltage signal input from the voltage signal input end into a first high level signal and a second high level signal, wherein the first high level signal and the second high level signal are both positively correlated with a temperature of the variable gain amplifier, and the first high level signal has a potential higher than that of the second high level signal;
   a switch signal conversion module comprising a high level signal input end, N digital signal input ends and N switch signal output ends, wherein the high level signal input end is electrically connected to the first high level signal output end, the N switch signal output ends are in one-to-one correspondence with the N digital signal input ends, and the switch signal conversion module is configured to output, through the corresponding N switch signal output ends and under a control of signals input from the N digital signal input ends, gain control signals associated with the first high level signal output from the first high level signal output end; and an amplification module comprising an amplification unit and N stages of gain control units, wherein the N stages of gain control units are in one-to-one correspondence with the N switch signal output ends of the switch signal conversion module, each gain control unit has a control end electrically connected to a corresponding switch signal output end, an input end electrically connected to the voltage signal input end, and an output end electrically connected to an intermediate node of the amplification unit, and is capable of providing a voltage signal positively correlated with the temperature to the intermediate node under a control of a signal received by the control end of the gain control unit, and the amplification unit has an input end electrically connected to the second high level signal output end and a control end electrically connected to the first high level signal output end, where N is a positive integer not less than 1.

2. The variable gain amplifier according to claim 1, wherein the switch signal conversion module comprises N switch signal conversion units which are in one-to-one correspondence with the N digital signal input ends and in one-to-one correspondence with the N switch signal output ends,
wherein each switch signal conversion unit has a control end electrically connected to a corresponding digital signal input end, an input end electrically connected to the first high level signal output end, and an output end electrically connected to a corresponding switch signal output end, and
wherein each switch signal conversion unit is capable of electrically connecting the input end of the switch signal conversion unit with the output end of the switch signal conversion unit when the control end of the switch signal conversion unit receives a digital signal valid to the switch signal conversion unit.

3. The variable gain amplifier according to claim 2, wherein each switch signal conversion unit comprises a first switch signal conversion transistor and a second switch signal conversion transistor, a gate electrode of the first switch signal conversion transistor and a gate electrode of the second switch signal conversion transistor are electrically connected with each other and both electrically connected to a corresponding digital signal input end, a first electrode of the first switch signal conversion transistor is electrically connected to the high level signal input end, a second electrode of the first switch signal conversion transistor is electrically connected to a first electrode of the second switch signal conversion transistor, a second electrode of the second switch signal conversion transistor is electrically connected to a low level signal reference end, and wherein one of the first switch signal conversion transistor or the second switch signal conversion transistor is a P-type transistor, while the other is an N-type transistor.

4. The variable gain amplifier according to claim 3, wherein the first switch signal conversion transistor is a P-type transistor, and the second switch signal conversion transistor is an N-type transistor.

5. The variable gain amplifier according to claim 1, wherein the high level generation module comprises:
a current source having an input end formed as the voltage signal input end, and an output end for outputting a current that is positively correlated with the temperature of the variable gain amplifier; and
a current conversion unit having an input end electrically connected to an output end of the current source, a first output end formed as the first high level signal output end, and a second output end formed as the second high level signal output end, wherein the current conversion unit is configured to convert the current into the first high level signal and the second high level signal, respectively, and output the first high level signal through the first output end and the second high level signal through the second output end.

6. The variable gain amplifier according to claim 5, wherein the current conversion unit comprises a first current conversion transistor and a second current conversion transistor;
a gate electrode of the first current conversion transistor is electrically connected to a first electrode of the first current conversion transistor and formed as an input end of the current conversion unit, and the first output end is electrically connected to the first electrode of the first current conversion transistor; and
a gate electrode of the second current conversion transistor and a first electrode of the second current conversion transistor are electrically connected with each other and both electrically connected to a second electrode of the first current conversion transistor, the second output end is electrically connected to the first electrode of the second current conversion transistor, and a second electrode of the second current conversion transistor is electrically connected to a low level signal reference end.

7. The variable gain amplifier according to claim 1, wherein each gain control unit comprises a gain transistor, a first electrode, and a second electrode, and wherein the gain transistor has a gate electrode formed as the control end of the gain control unit, the first electrode is electrically connected to the voltage signal input end, and the second electrode is formed as the output end of the gain control unit.

8. The variable gain amplifier according to claim 1, wherein the amplification unit comprises a first amplification transistor and a second amplification transistor, a gate electrode of the first amplification transistor is formed as a control end of the amplification unit, a first electrode of the first amplification transistor is electrically connected to an output end of the amplification unit, and a second electrode of the first amplification transistor is electrically connected to the intermediate node; and
a gate electrode of the second amplification transistor is formed as the input end of the amplification unit, a first electrode of the second amplification transistor is electrically connected to the second electrode of the first amplification transistor, and a second electrode of the second amplification transistor is electrically connected to a low level signal reference end.

9. The variable gain amplifier according to claim 8, wherein the amplification unit further comprises a resistance element having one end electrically connected to the voltage signal input end and the other end electrically connected to the first electrode of the first amplification transistor.

10. A transmitting apparatus, comprising an intermediate frequency variable gain amplifier, a mixer, a radio frequency variable gain amplifier, and a power amplifier connected in sequence, wherein at least one of the intermediate frequency variable gain amplifier or the radio frequency variable gain amplifier is the variable gain amplifier according to claim 1.

* * * * *